United States Patent
Maeda

(10) Patent No.: US 10,177,336 B2
(45) Date of Patent: Jan. 8, 2019

(54) METHOD OF MANUFACTURING A DISPLAY DEVICE WITH AN AUXILIARY WIRING

(71) Applicant: Japan Display Inc., Tokyo (JP)

(72) Inventor: Norihisa Maeda, Tokyo (JP)

(73) Assignee: Japan Display Inc., Tokyo (JP)

(*) Notice: Subject to any disclaimer, the term of this patent is extended or adjusted under 35 U.S.C. 154(b) by 103 days.

(21) Appl. No.: 15/686,303

(22) Filed: Aug. 25, 2017

(65) Prior Publication Data

US 2017/0358770 A1    Dec. 14, 2017

Related U.S. Application Data

(63) Continuation of application No. 14/877,700, filed on Oct. 7, 2015, now Pat. No. 9,786,866.

(30) Foreign Application Priority Data

Oct. 8, 2014  (JP) .................................. 2014-207598

(51) Int. Cl.
*H01L 51/52*  (2006.01)
*H01L 27/32*  (2006.01)

(52) U.S. Cl.
CPC ...... *H01L 51/5228* (2013.01); *H01L 27/3279* (2013.01)

(58) Field of Classification Search
CPC .................. H01L 51/5228; H01L 27/3279
See application file for complete search history.

(56) References Cited

U.S. PATENT DOCUMENTS

2002/0187265 A1  12/2002  Mori et al.
2004/0113550 A1   6/2004  Adachi et al.
(Continued)

FOREIGN PATENT DOCUMENTS

CN        1841761 A    10/2006
JP   2004-192977 A     7/2004
(Continued)

OTHER PUBLICATIONS

Korean Office Action dated Jul. 10, 2017, for corresponding Korean Application No. 10-2015-0130262.
(Continued)

*Primary Examiner* — Kyoung Lee
(74) *Attorney, Agent, or Firm* — TYPHA IP LLC

(57) ABSTRACT

A display device includes a plurality of pixels arranged on a substrate, a plurality of pixel electrodes, wherein each pixel electrode of the plurality of pixel electrodes corresponds to a pixel of the plurality of pixels, a bank between adjacent pixel electrodes of the plurality of pixel electrodes, wherein the bank exposes a part of the pixel electrodes, an electroluminescent layer on each of the plurality of pixel electrodes, a common electrode above the bank and the electroluminescent layer, a plurality of insulators on the exposed regions of the pixel electrodes, wherein the common electrode is between the insulators and the pixel electrodes, and an auxiliary wiring on the common electrode between adjacent insulators of the plurality of insulators, wherein a top surface of each insulator of the plurality of insulators is farther from the substrate than a top surface of the common electrode.

12 Claims, 10 Drawing Sheets

(56) References Cited

U.S. PATENT DOCUMENTS

| | | | |
|---|---|---|---|
| 2004/0160165 A1* | 8/2004 | Yamauchi | H01L 27/3246 313/498 |
| 2005/0001963 A1 | 1/2005 | Yokoyama | |
| 2005/0285987 A1* | 12/2005 | Azumada | G02F 1/136286 349/43 |
| 2008/0150421 A1 | 6/2008 | Takata | |
| 2008/0185959 A1 | 8/2008 | Kurauchi | |
| 2010/0051973 A1 | 3/2010 | Kobayashi et al. | |
| 2010/0078627 A1 | 4/2010 | Yoshinaga | |
| 2010/0102713 A1 | 4/2010 | Seo et al. | |
| 2011/0031514 A1 | 2/2011 | Sakaguchi et al. | |
| 2014/0183502 A1* | 7/2014 | Song | H01L 27/3246 257/40 |
| 2014/0284572 A1 | 9/2014 | Oooka et al. | |
| 2016/0293880 A1* | 10/2016 | Hakii | C22C 5/04 |

FOREIGN PATENT DOCUMENTS

| | | |
|---|---|---|
| JP | 2007-227129 A | 9/2007 |
| JP | 2008-098148 A | 4/2008 |
| JP | 2008-176291 A | 7/2008 |
| JP | 2008-192477 A | 8/2008 |
| JP | 2009-276721 A | 11/2009 |
| JP | 2010-118291 A | 5/2010 |
| JP | 2012-033307 A | 2/2012 |
| JP | 2012-216454 A | 11/2012 |
| KR | 10-2007-0054799 A | 5/2007 |
| KR | 10-2010-0047457 A | 5/2010 |
| KR | 10-2014-0109153 A | 9/2014 |
| TW | 200635433 A | 10/2006 |
| WO | 2011/016126 A1 | 2/2011 |

OTHER PUBLICATIONS

Korean Office Action dated Jan. 5, 2017, for corresponding Korean Application No. 10-2015-0130262.

Taiwanese Office Action dated Jun. 27, 2016 for the corresponding Taiwanese Patent Application No. 10413244 7 with partial English Translation.

Chinese Office Action dated Dec. 26, 2017 for the corresponding Chinese application No. 201510629495.9 with partial English translation.

Japanese Office Action dated Aug. 21, 2018 for the corresponding Japanese Patent Application No. 2014-207598, with partial English machine translation.

* cited by examiner

US 10,177,336 B2

METHOD OF MANUFACTURING A DISPLAY DEVICE WITH AN AUXILIARY WIRING

CROSS REFERENCE TO RELATED APPLICATIONS

This application is a continuation of U.S. patent application Ser. No. 14/877,700, filed on Oct. 7, 2015. Further, this application is based upon and claims the benefit of priority from the prior Japanese Patent Application No. 2014-207598, filed on Oct. 8, 2014, the entire contents of which are incorporated herein by reference.

FIELD

The present invention is related to a display device including a light emitting element such as an electroluminescence element and a manufacturing method of the display device.

BACKGROUND

An electroluminescence (referred to below as EL) element is known as a light emitting element which uses an electroluminescence phenomenon. An EL element can emit light in colors of various wavelengths by selecting a light emitting material which forms a light emitting layer, and their application to display devices and lighting fixtures is progressing. In particular, an EL element which uses an organic material as a light emitting material is attracting attention.

In a display device using an EL element, an EL element as a light emitting element and a switching element which performs light emitting control of the EL element are arranged in each pixel arranged in a matrix shape above a substrate. In addition, by controlling the ON/OFF of a switching element for each pixel, it is possible to display an optional image across an entire display area.

Two types of display devices described above are known, a top emission type and bottom emission type. A top emission type is a method in which light emitted by an EL element is extracted to the opposite side of a first substrate, that is, second substrate (sealing substrate) side, formed with a pixel circuit, and a bottom emission type is a method in which light emitted by an EL element is extracted to an array substrate side. In particular, since a bottom emission type is arranged with a pixel electrode above a region formed with a pixel circuit and can effectively use the majority of a pixel electrode as a light emitting region, a bottom emission type is effective in being able to secure a high aperture ratio of a pixel.

In a top emission type EL display device, it is necessary to extract light that has passed through a common electrode (cathode) which becomes a pair with a pixel electrode (anode). Therefore, in a top emission type, MgAg (Magnesium-Silver Alloy,) which is formed into a thin film so as to sufficiently allow light to pass through, is used as the common electrode, and a transparent conductive film of ITO (Indium Tin Oxide) or IZO (Indium Zinc Oxide) is often used.

Among these, an ITO or IZO transparent conductive film has a higher resistance compared to a metal film. Therefore, when the size of a pixel in a display device increases, the effects of a drop in voltage due to the resistance component of a transparent conductive film increases which leads to problems such as differences in luminosity in a screen.

A structure in which auxiliary wiring is arranged above a common electrode after forming a common electrode is disclosed as a method for solving the phenomenon described above in Japanese Laid Open Patent 2009-276721. The above described technology aims to achieve low resistance of a common electrode by arranged auxiliary wiring comprise from a metal film above a common electrode. In addition, efforts are made for the auxiliary wiring to not cause a decrease in the aperture ratio of a pixel by arranging the auxiliary wiring above a bank. Furthermore, a bank is a component is formed from an insulation material such as a resin which sections a pixel.

In the technology described above, it is difficult to align a bank and auxiliary wiring in the case where high definition of a display device has progressed, and when alignment precision is poor, the auxiliary wiring is sometimes formed within a pixel. As a result, the auxiliary wiring may block the light emitted from an EL element leading to a decrease in an aperture ratio.

Therefore, an aim of one embodiment of the present invention is to provide a technology for forming auxiliary wiring above a common electrode with high alignment precision.

In addition, an aim of one embodiment of the present invention is to provide a high definition display device securing both low resistance of a common electrode and a sufficient aperture ratio using auxiliary wiring.

SUMMARY

DESCRIPTION OF EMBODIMENTS

Each embodiment of the present invention is explained below while referring to the diagrams. However, the present invention can be performed by various modifications without departing from the scope of the invention and the invention should not be interpreted as being limited to the details described in the embodiments exemplified below.

In addition, in order to clarify explanation, the width, thickness and shape etc of each component in the diagrams are represented schematically compared to actual components, however, these are only examples and do not restrict an interpretation of the present invention. In addition, in the specification and each diagram, the same reference symbols are attached to components that are arranged with same function as components explained in previous diagrams and overlapping explanations may be omitted.

(First Embodiment)
<Structure of a Display Device>

Figure 1:
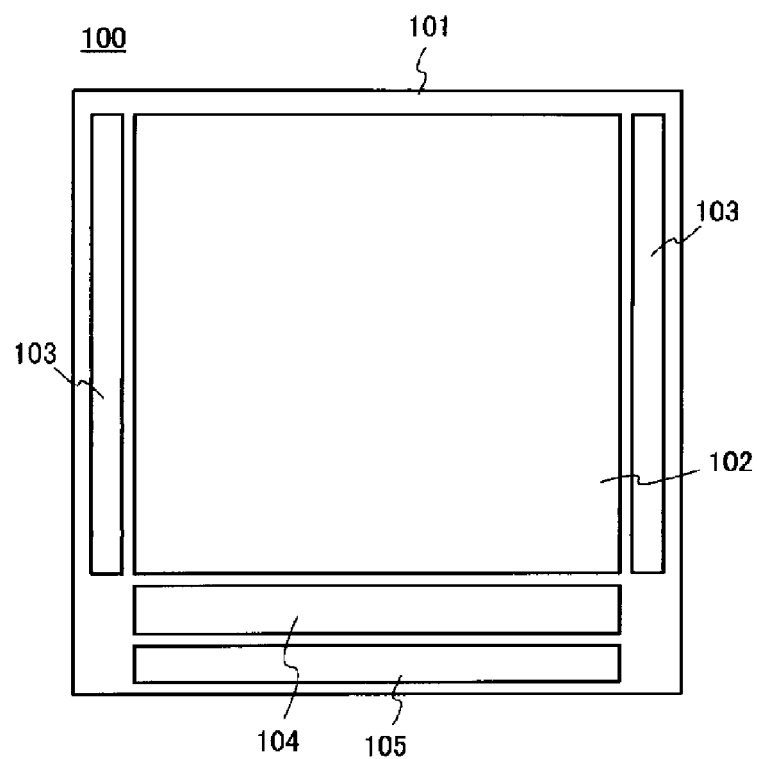
FIG. 1 is a planar view diagram showing a structure of an entire display device related to a first embodiment of the present invention.

FIG. 1 is a diagram showing an entire structure of a display device 100 related to a first embodiment of the present invention. The display device 100 is arranged with a pixel part (display region) 102, scanning line drive circuit 103, data line drive circuit 104 and driver IC circuit 105 formed above a substrate 101. The driver IC functions as a control part for providing a signal to the scanning line circuit 103 and data line drive circuit 104.

Furthermore, the data line driver circuit 104 may be included in the driver IC 105. In FIG. 1, although an example is shown in which the driver IC 105 is integrally formed above the substrate 101, the driver IC 105 may also be arranged above a separate substrate 101 in a form such as an IC chip. In addition, the driver IC 105 may also be arranged externally in an FPC (Flexible Printed Circuit).

A plurality of pixels is arranged in a matrix shape in the pixel part 102 shown in FIG. 1. A data signal is provided according to image data from the data line drive circuit 104 in each pixel. By providing the data signals to each pixel electrode via a switching element arranged in each pixel, it is possible to display a screen according to image data. Typically, it is possible to use a thin film transistor (referred to herein as "TFT") as the switching element. However, the switching element is not limited to a thin film transistor and any element may be used as long as it is arranged with a switching function.

Figure 2:
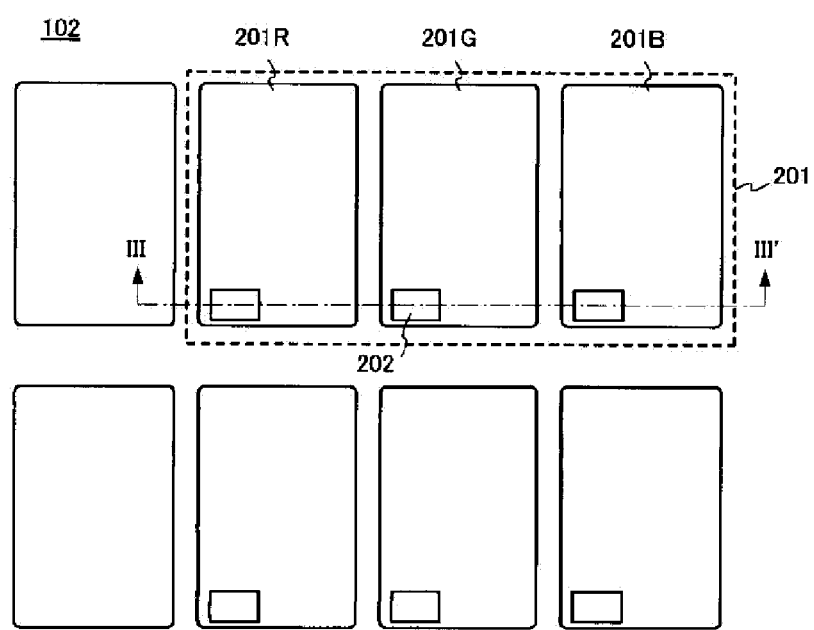
FIG. 2 is a planar view diagram showing a structure of a pixel part in a display device related to a first embodiment of the present invention.

FIG. 2 is a diagram showing a structure of a pixel part 102 in the display device 100 shown in FIG. 1. In the present embodiment, a pixel 201 includes a sub-pixel 201R corresponding to red (R), a sub-pixel 201G corresponding to green (G), and a sub-pixel 201 B corresponding to blue (B). A thin film transistor 202 is arranged as a switching element in each sub-pixel. By controlling each sub-pixel 201R, 201G and 201B to be ON or OFF using the thin film transistor 202, it is possible to emit light in an arbitrary color corresponding to each sub-pixel and represent various colors as one image.

Although a structure is shown in FIG. 2 using three primary colors RGB as a sub-pixel, the present invention is not limited to this structure. A structure is also possible in which a pixel 201 is formed using four sub-pixels with a white pixel (W) or yellow pixel (Y) is added to RGB. In addition, although an example is exemplified in which pixels corresponding to the same color are arranged in a stripe shape as a pixel arrangement, other arrangements are also possible such as a delta arrangement, Bayer arrangement or PenTile structure.

Figure 3:
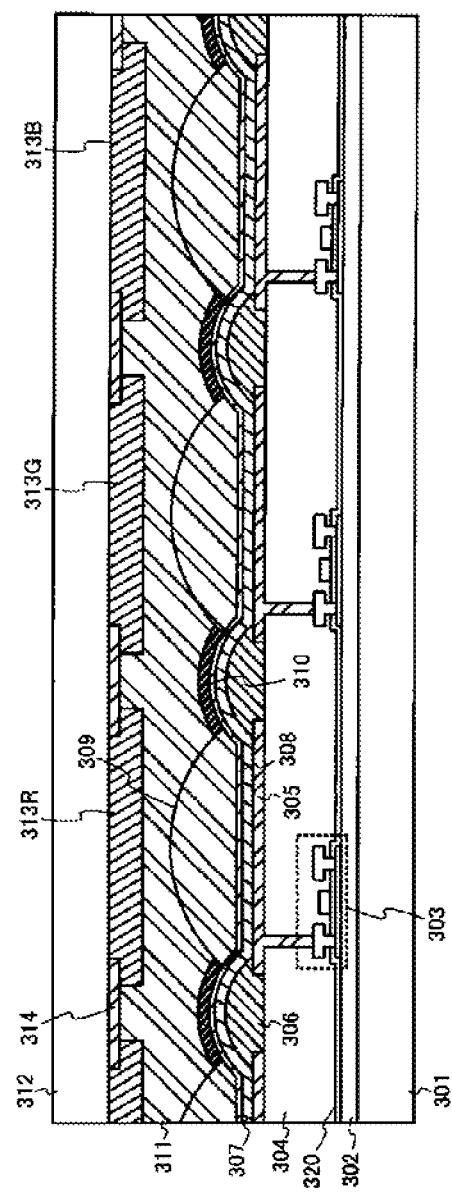
FIG. 3 is a diagram showing a structure of a cross section of a pixel part in a display device related to a first embodiment of the present invention and shows a cross section along the line shown in FIG. 2.

FIG. 3 is a diagram showing a cross-sectional structure of the pixel 201 shown in FIG. 2 along the line An insulation layer formed from an inorganic material such as silicon oxide, silicon nitride or aluminum oxide is arranged as a undercoat layer 302 above the first substrate (array substrate) 301 and a thin film transistor 303 is formed thereupon.

It is possible to use a glass substrate, silica substrate, flexible substrate (polyimide, polyethylene terephthalate, polyethylene naphthalate or other substrate that can be bent) as the first substrate 301. In the case where the first substrate 301 is not required to include transparency, it is possible to use a metal substrate, ceramic substrate or semiconductor substrate.

The structure of the thin film transistor 303 may be a top gate type or bottom gate type. In the display device 100 of the present embodiment, a structure is adopted in which a first insulation layer 304 is arranged to cover the thin film transistor 303 and any concave/convex parts caused by the thin film transistor 303 are flattened. A resin material is preferred to be used as the first insulation layer 304. For example, it is possible to use a known organic material such as polyimide, polyamide, acrylic or epoxy and the like. An inorganic material such as silicon oxide may be used in addition to an organic material if flattening effects are desired and it is possible to use a stacked layer structure of organic and inorganic materials. Furthermore, the layer shown by 320 is an inorganic insulation film such as a silicon oxide film which functions as a gate insulation layer of the thin film transistor 303.

A pixel electrode 305 is arranged above the first insulation layer 304. The pixel electrode 305 is connected to the thin film transistor 303 via a contact hole formed in the first insulation layer 304. In the display device 100 of the present embodiment, the pixel electrode 305 functions as an anode which forms an EL element.

The pixel electrode 305 is formed from a different structure of either a top emission type or bottom emission type. For example, in the case of a top emission type structure, either a metal film with high reflectance is used as the pixel electrode 305, or a stacked layer structure of a transparent conductive film with a high work function and a metal film such an indium oxide transparent conductive film (ITO for example) or zine oxide transparent conductive film (IZO, ZnO for example) may be used. Reversely, in the case of a bottom emission type structure, the transparent conductive films described above may be used as the pixel electrode 305. In the present embodiment, a top emission type display device is explained as an example.

As is shown in FIG. 3, a bank 306 is arranged between adjacent pixel electrodes 305. The bank 306 is arranged to cover an end part (edge) of each pixel electrode 306 and as a result functions as a component for sectioning each pixel. Furthermore, the bank 306 not only covers the end part of the pixel electrode 306 but may also functions as a filler material for burying concave parts caused by a contact hole.

In the present embodiment, it is possible to use a polyimide group, polyamide group, acrylic group, epoxy group or resin material such as a siloxane group as the bank 306. In addition, although an example in which an outline of a cross-section (cross-section cut at a surface perpendicular to a main surface of the pixel electrode) including a peak part of the bank 306 forms a curved shaped bank in FIG. 3, the shape is not particularly limited. The outline of the bank 306 may also have a trapezoidal shape for example.

An electroluminescence layer (EL layer) 307 is arranged above the pixel electrode 305 and bank 306. The EL layer 307 includes at least a light emitting layer and functions as a light emitting part of an EL element. Apart from a light emitting layer, each type of functional layer such as an electron injection layer, electron transport layer, hole injection layer and hole transport layer may be included in the EL layer 307. These layers are formed using a low molecular or high molecular organic material. In addition, not only an organic material but an electroluminescence type quantum dot may also be used as the light emitting layer.

In the present embodiment, the EL layer 307 which emits white color light is arranged and has a structure for separating colors using a color filter described below. The structure of the EL layer 307 is not particularly limited to the structure of the present embodiment. In addition, the EL layer 307 may be formed only above each pixel electrode 305, and not formed continuously above the bank 306. For example, each pixel electrode 305 may be painted for different colors respectively.

A common electrode 308 which functions as a cathode of an EL element is arranged above the EL layer 307. Since the display device 100 of the present embodiment is a top emission type device, a MgAg thin film or transparent conductive film (ITO or IZO) is used as the common electrode 308. The common electrode 308 is formed on the entire surface of the pixel part 102 bridged between each pixel.

Here, in the display device 100 of the present embodiment, a mask insulator 309 is formed in a position corresponding to each pixel above the common electrode 308. The mask insulator 309 has transparency and can be typically formed using a polyimide group, polyamide group, acrylic group, epoxy group or resin material such as a siloxane group. Although described below, it is preferred that the mask insulator 309 has the same material as the filler material 311. In addition, although the mask insulator 309 may be a light cured resin or thermosetting resin, it is preferred that a light cured resin is used in order to suppress the effects on a lower layer EL layer 307.

The mask insulator 309 is arranged within a section enclosed by the bank 306 (in other words, above an effective light emitting region) and the end part overlaps the bank 306 as is shown in FIG. 3. In addition, the thickness of the mask insulator 309 is set so that the peak part of the mask insulator 309 is positioned further upwards than the peak part of the bank 306 (strictly speaking, the peak part of the common electrode 308 above the bank 306) when the main surface of the pixel electrode 305 is used as reference. This is to make the mask insulator 309 function as a stopper when forming the auxiliary wiring 310 described below.

Furthermore, in the present embodiment, because the mask insulator 309 is formed using an inkjet method for example, the cross-section of a surface including a peak part has a curved shape. That is, in the case where the mask insulator 309 is cut at a surface perpendicular to a main surface of the pixel electrode 305, the outline of the mask insulator 309 has a curved shape. However, actually since the shape of the cross-section including a peak part of the mask insulator 309 depends on the shape of a pixel sectioned by the bank 306, a straight line part is also possible.

In FIG. 3, the auxiliary wiring 310 is arranged above a part overlapping the bank 306 part of the common electrode 308. In other words, the auxiliary wiring 310 is arranged between adjacent mask insulators 309. Specifically, since a solvent including a conductor is coated in a gap between a plurality of mask insulators 309 and the solvent is vaporized to form the auxiliary wiring 310, the end part of the auxiliary wiring is in contact with the mask insulator 309 as is shown in FIG. 3.

It is possible to use a metal colloid including silver (Ag) or titanium (Ti) or a metal nanowire as the conductor which forms the auxiliary wiring 310. In addition, a conductive material such as carbon black may also be used. By dispersing these conductors into the volatile solvent and removing the solvent after coating, it is possible to form the auxiliary wiring formed by the conductor described above. Of course, it is also possible to use other wiring forming technologies as long as they do not damage the common electrode 308.

A counter substrate is arranged via the filler material 311 which functions as an adhesive and protective material on the upper part of the mask insulator 309 and auxiliary wiring 310. It is possible to use a polyimide group, polyamide group, acrylic group, epoxy group or resin material such as a siloxane group as the filler material 311. On the other hand, if sufficient sealing at the substrate periphery part and a gap support between the first substrate and second substrate can be realized, it is possible to form a hollow seal without using the filler material 311.

Furthermore, in the present embodiment, an [counter substrate] includes color filters 313R, 313G, 313B corresponding to each RGB color arranged in a second substrate 312 and a main surface (surface facing the first substrate 301) of the second substrate 312 and a black matrix 314 arranged in a gap between the color filters.

However, the structure of the counter substrate is not limited to this structure and the black matrix 314 may be omitted. In addition, if the EL layer 307 is separated in each RGB color, it is possible to omit the color filters from the counter substrate. Furthermore, if the color filters are omitted or formed on the first substrate 301 side, it is possible to completely omit the counter substrate.

Since the display device 100 of the present embodiment explained above is formed with the self-aligning auxiliary wiring 310 using the mask insulator 309, the auxiliary wiring 310 can be arranged above the bank 306 with a high level of positioning accuracy even if high definition progresses. As a result, the auxiliary wiring 310 is formed not above an effective light emitting region (inside a region which functions effectively as a pixel) and it is possible to prevent a drop in an effective aperture ratio. At the same time, it is possible to obtain a low resistance common electrode 308 by electrically connecting with the auxiliary wiring 310 and improve uniformity of luminosity within the display region 102.

A manufacturing process of the display device 100 of the present embodiment arranged with structure described above is explained below.

<Manufacturing Method of a Display Device>

Figure 4:
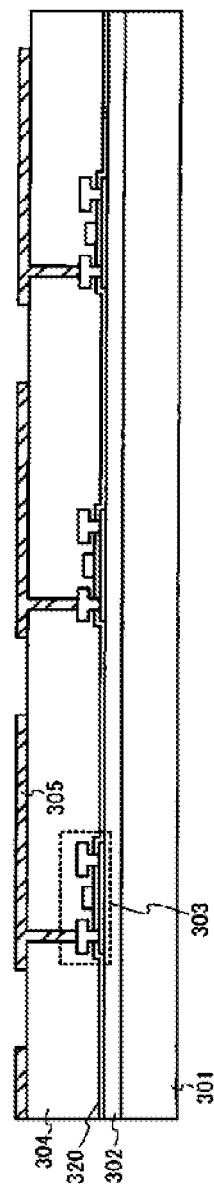
FIG. 4 is a diagram showing a manufacturing method of a display device related to a first embodiment of the present invention.

First, as is shown in FIG. 4, an undercoat layer 302 is formed above the first substrate 301 and above this a thin film transistor (TFT) 303 is formed. Next, a first insulation layer 304 is formed so that any concave/convex parts produced by the formation of the thin film transistor 303 are flattened.

It is possible to use a glass substrate, silica substrate, flexible substrate (polyimide, polyethylene terephthalate, polyethylene naphthalate or other substrate that can be bent) as the first substrate 301. In the case where the first substrate 301 is not required to include transparency, it is possible to use a metal substrate, ceramic substrate or semiconductor substrate.

Typically, it is possible to use a silicon oxide insulation film, silicon nitride insulation film or a stacked layer of these as the ground layer 302. The undercoat layer 302 prevents the infiltration of contaminated substances from the first substrate 301 and includes a function for relieving stress which is generated due to the expansion of the first substrate 301.

In the present embodiment, although an example in which a top gate type TFT is formed as the thin film transistor 303 is exemplified, a bottom gate type TFT may also be used. In addition, if the thin film transistor is an element which functions as a switching element, the present invention is not limited to a three terminal element such as a thin film transistor, a two terminal element may be formed and a resistance element or capacitor element may also be formed according to the necessity of a pixel circuit.

The first insulation layer 304 is formed by coating a polyimide group, polyamide group, acrylic group, epoxy group or resin material such as a siloxane group and then the coated resin material is cured by light or heat. The thickness of the first insulation layer 304 should be a sufficient thickness to flatten any concave/convex parts caused by the thin film transistor 303. Typically, although it is possible to form the first insulation layer 304 to a thickness from 1 to 3 μm, the first insulation layer 304 is not limited to this thickness.

Next, after forming a contact hole to reach the thin film transistor 303 in the first insulation layer 304, the pixel electrode 305 is formed using a known method. In the present embodiment, after forming a stacked layer film of aluminum and ITO (Indium Tin Oxide) using a sputtering method, the pixel electrode 305 is formed by patterning the stacked layer film using photolithography. Each pixel electrode 305 is patterned formed so that each corresponds to a position corresponding to a plurality of pixels respectively.

Figure 5:
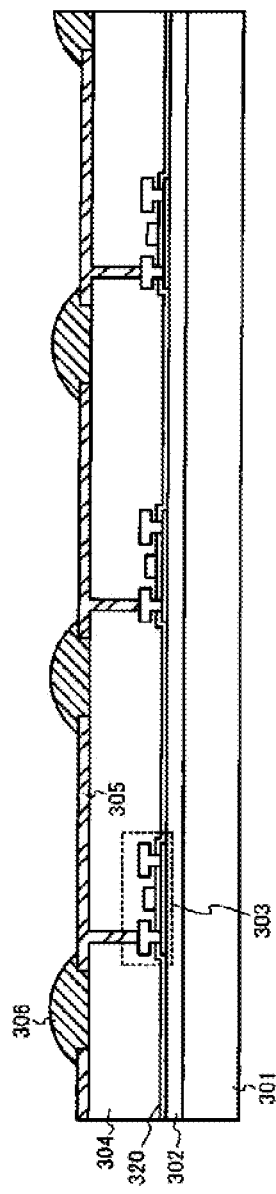
FIG. 5 is a diagram showing a manufacturing method of a display device related to a first embodiment of the present invention.

Next, the bank 306 formed from a resin material is formed as is shown in FIG. 5. In the present embodiment, the bank 306 is formed by coating a light cured resin using an inkjet method for example. At this time, alignment is performed so that it is possible to coat a solvent between adjacent pixel electrodes 305, and since the bank 306 is formed by curing using irradiation after coating the solvent, an outline of a cross-section including the peak part is formed into a curved shape due to surface tension. However, the shape of the bank 306 is not particularly limited and may be a trapezoidal shape. Therefore, in the present embodiment, although the bank 306 is formed using an inkjet method, the bank 306 may also be pattern formed via photolithography or formed using a printing method.

Figure 6:
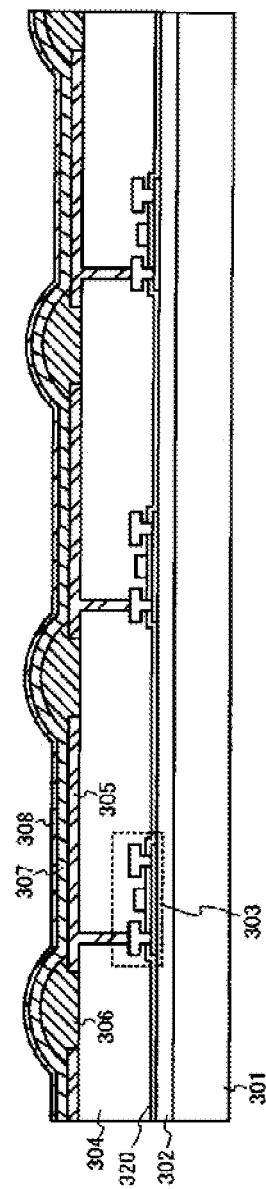
FIG. 6 is a diagram showing a manufacturing method of a display device related to a first embodiment of the present invention.

Next, the EL layer 307 is formed as is shown in FIG. 6. In the present embodiment, the EL layer 307 is formed as a light emitting part of white light. Each type of functional layer such as a hole injection layer, hole transport layer, electron injection layer, electron transport layer and charge generating layer may also be arranged according to necessity. In addition, the EL layer 307 can be formed using a sputtering method, an inkjet method, a printing method or evaporation method for example.

After forming the EL layer 307, the common electrode 308 which functions as a cathode of an EL element is formed. In the present embodiment, an ITO film or IZO film formed using a sputtering method is used as the common electrode 308. Of course, other transparent conductive films may also be used and a metal film such as MgAg may also be used. In the case where a metal film is used, the film thickness may be set to the extent whereby light output from the EL element can pass through.

Figure 7:
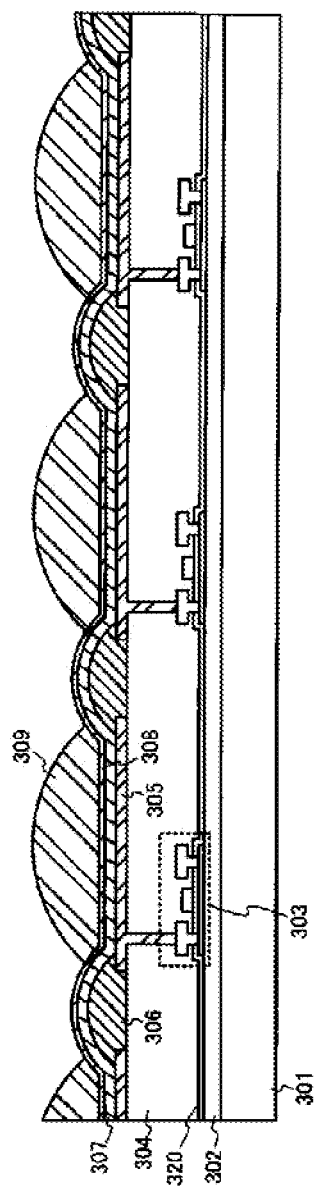
FIG. 7 is a diagram showing a manufacturing method of a display device related to a first embodiment of the present invention.

Next, the mask insulator 309 is formed as is shown in FIG. 7. In the present embodiment, an acrylic resin with light curing properties is coated using an inkjet method for example, and cured using irradiation to form the mask insulator 309. As a result, in the case where the mask insulator 309 is cut at a surface perpendicular to a main surface of the pixel electrode 305, the outline of the mask insulator 309 has a curved shape. At this time, in order to not expose the common electrode 308 to the outside air, it is desirable to treat the common electrode in an inactive atmosphere such as a nitrogen atmosphere.

When forming the mask insulator 309, attention should be paid to the viscosity of the solvent including a resin material or the amount that is discharged. Specifically, the viscosity of the solvent or amount that is discharged (in other words, thickness of the mask insulator) is adjusted so that the peak part of the mask insulator 309 is positioned further upwards than the peak part of the bank 306 (strictly speaking, peak part of the common electrode 308 above the bank 306) when the main surface of the common electrode 305 is used as a reference. That is, the viscosity of the solvent or amount that is discharged is adjusted and the thickness of the mask insulator 309 is adjusted in order to satisfy the conditions. This is to make the mask insulator 309 function as a stopper (wall) when subsequently coating the auxiliary wiring 310.

In addition, it is preferred that the discharge amount is controlled so that an end part (edge) when viewing the mask insulator 309 from the normal direction with respect to a main surface of the first substrate 101 overlaps the bank 306. That is, as is shown in FIG. 7, the discharge amount is controlled so that the end part of the mask insulator 309 is positioned above an incline part caused by the shape of the bank 306 within a range that does not exceed the peak part of the bank 306. This is so that the position of the end part of the mask insulator 309 becomes the position of the end part of the auxiliary wiring 310. Therefore, by adopting the positional relationship described above, it is possible to prevent the auxiliary wiring 310 from being formed above an effective light emitting region.

Furthermore, it is not necessary for the mask insulator 309 to be divided for each pixel in all the pixels. That is, even if there are a few sections where the mask insulator 309 is linked in between adjacent pixels, there is no loss in the effect of the present invention. For example, when the mask insulator 309 is linked between adjacent pixels, contact between the auxiliary wiring 310 and the common electrode 308 cannot be secured at those sections. However, since the common electrode 308 is supplied with same potential across the entire surface, if contact between the auxiliary wiring 310 and common electrode 308 can be secured at a plurality of sections, it is possible to achieve a low resistance common electrode as a whole.

Figure 8:
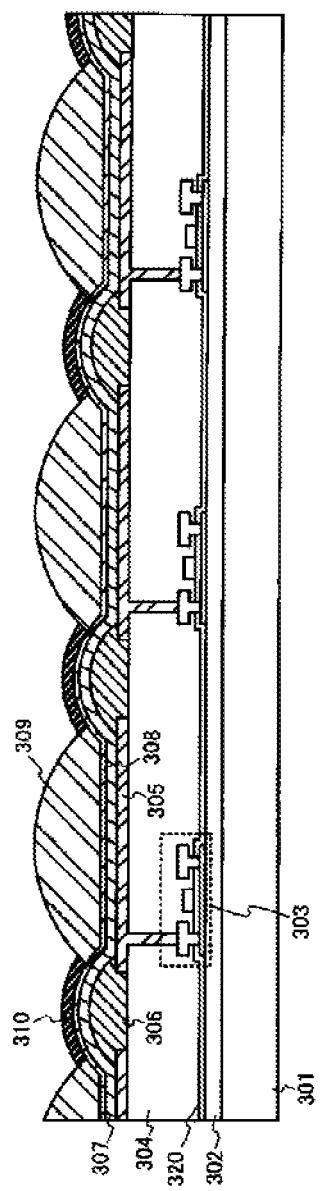
FIG. 8 is a diagram showing a manufacturing method of a display device related to a first embodiment of the present invention.

Next, the auxiliary wiring 310 is formed as is shown in FIG. 8. In the present embodiment, a solvent dispersed with a metal colloid including silver is coated using an inkjet method for example and following this, the solvent is vaporized and the auxiliary wiring 310 including silver is formed. At this time, by performing alignment in the gaps between adjacent mask insulators 309 and coating the solvent, it is possible to accurately form the auxiliary wiring 310 above the bank 306. In other words, it is possible to form a self-aligned auxiliary wiring 310 using the mask insulator 309.

After forming the auxiliary wiring 310, a counter substrate arranged with color filters 313R, 313G, 313B and the black matrix 314 is formed above a second substrate 312. The second substrate 312 can be formed using a substrate having transparent such as a glass substrate, silica substrate, flexible substrate (polyimide, polyethylene terephthalate, polyethylene naphthalate or other substrate that can be bent). The color filters 313R, 313R, 313B are formed using a resin material dispersed with each color pigment. The black matrix 314 may be formed used titanium film or a resin film containing carbon black. Not limited to this, a known structure and known material can be used as the structure of the sealing substrate. Of course, the structure of the counter substrate is not limited to this.

Following this, the counter substrate is bonded using the filler material 311 and the display device 100 shown in FIG. 3 is completed. A resin material with light curing properties is used as the filler material 311. In the present embodiment, by using the same material as the mask insulator 309, it is possible to use a part of the filler material 311 as it is without removing the mask insulator 309. Of course, the mask insulator 309 and filler material 311 may also be formed using different materials. In the case where the mask insulator 309 and filler material 311 are formed using different materials, it is possible to use the mask insulator 309 like a micro-lens using the refractive index difference of both.

According to the manufacturing method of the display device related to the present embodiment explained above, by forming a self-aligned auxiliary wiring 310 using the mask insulator 309 arranged corresponding to a pixel, it is possible to arrange the auxiliary wiring 310 above the bank 306 at a high level of alignment accuracy. In addition, by forming the mask insulator 309 and the filler material 311 using the same material, it is possible to simplify the manufacturing process since it is not necessary to remove the mask insulator 309. Furthermore, by forming the bank 306 and mask insulator 309 using an inkjet method, it is possible to simplify the manufacturing process since it is possible to omit a patterning process such as photolithography.

(Second Embodiment)

Figure 9:
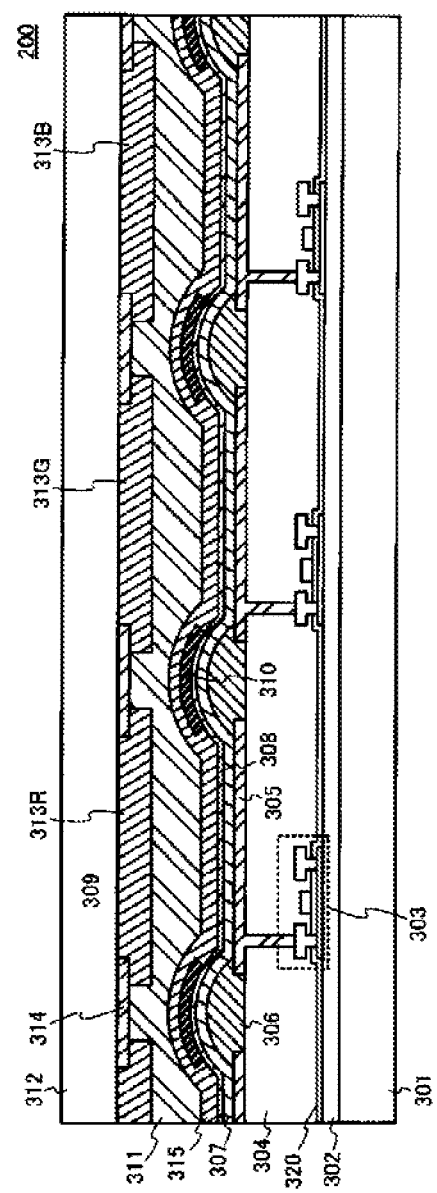
FIG. 9 is a diagram showing a structure of cross section of a pixel part in a display device related to a second embodiment of the present invention.

A structure of a pixel of a display device 200 related to a second embodiment of the present invention is shown in FIG. 9. The differences to the first embodiment are that in the display device 200 related to the second embodiment, the mask insulator 309 is removed and a sealing film 315 is arranged above the common electrode 308 and auxiliary wiring 310. The remaining structure is the same as the display device 100 related to the first embodiment.

In the present embodiment, the mask insulator 309 is removed after forming the auxiliary wiring 310 as is shown in FIG. 8 described previously. Although the removal method is not particularly limited, it is preferred that removal is performed using ashing in an oxygen or ozone atmosphere or by dry etching so that the lower layer common electrode 308 is not damaged. Specifically, opportune conditions may be appropriately set considering the selection ratio with the auxiliary wiring 310 or common electrode 308.

In addition, after removing the mask insulator 309, the sealing film 315 is arranged above the common electrode 308 and auxiliary wiring 310 as is shown in FIG. 9. The sealing film 315 prevents the infiltration of water or air from the exterior and is arranged with the purpose of controlling deterioration of a material that is weak to water such as the EL layer 307 and common electrode 308. As a result, it is preferred that an silicon nitrogen insulation layer arranged with a fine film substance is used as the sealing film 315. Furthermore, a silicon oxide or aluminum oxide inorganic insulation layer or resin organic insulation layer may be arranged as a stacked layer film.

Furthermore, although the counter substrate is bonding using the filler material 311 after forming the sealing film 315 in the present embodiment, a structure is also possible in which the counter substrate or filler material 311 is omitted. For example, in the case where a color filter is arranged on the first substrate 301 side and light emitting layers are separated and arranged for each RGB color, it is possible to omit the counter substrate. In this case, it is possible to obtain thinness and lightness across the entire display device 200.

In the present embodiment, the same as in the first embodiment, self-aligned auxiliary wiring is formed using a mask insulation film arranged within a pixel. Therefore, the display device 200 related to the present embodiment displays the same effects as those explained with respect to the display device 100 related to the first embodiment.

(Third Embodiment)

Figure 10:
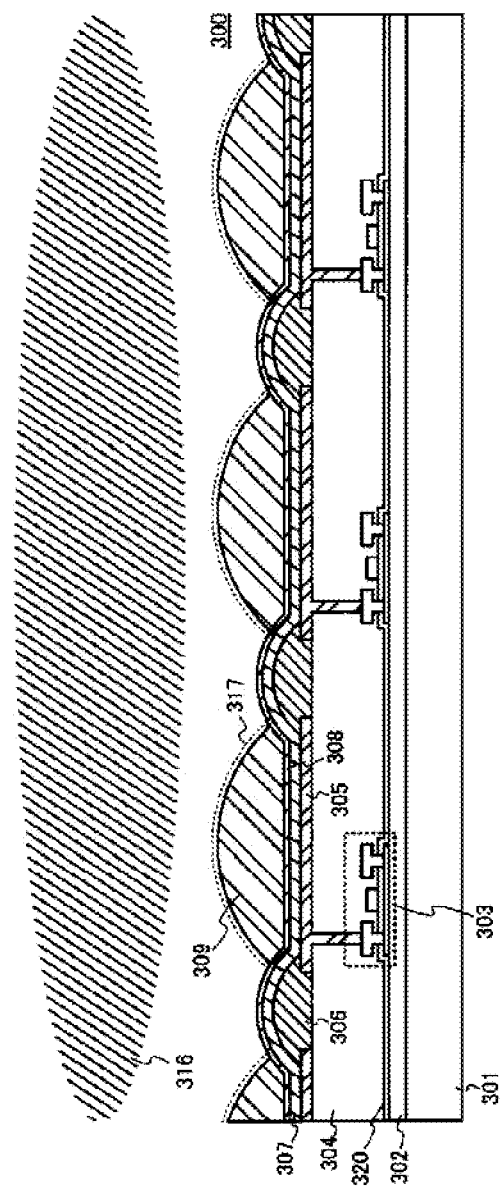
FIG. 10 is a diagram showing a manufacturing method of a display device related to a third embodiment of the present invention.

A structure of a pixel of a display device 300 related to a third embodiment of the present invention is shown in FIG. 10. The differences to the first embodiment are that in the display device 300 related to the third embodiment, after forming the mask insulator 309, a plasma process is performed on the surface and the surface of the mask insulator 309 is provided with water repellency. The remaining structure is the same as the display device 100 related to the first embodiment.

In the present embodiment, after forming the mask insulator 309 as is shown in FIG. 7 described previously, a plasma process is performed using fluorine or a gas containing a fluorine compound on the surface of the mask insulator 309.

A state in which the mask insulator 309 is exposed to an atmosphere forming a plasma 316 including fluorine is shown in FIG. 10. At this time, fluoride is produced on the surface of the mask insulator 309 formed with a resin material and water repellency is improved. As a result, when the solvent including a metal colloid in FIG. 8 is coated, the solvent coated on the surface of the mask insulator 309 having received a plasma treatment is repelled. Consequently, it is possible to form the auxiliary wiring 310 above the bank 306 with higher alignment accuracy.

In the present embodiment, the same as the first embodiment, a self-aligned auxiliary wiring is formed using a mask insulation film arranged in a pixel. Therefore, the display device 300 related to the present embodiment can also demonstrate the same effects explained with respect to the display device 100 related to the first embodiment.

As long as there is no mutual contradiction, each embodiment of the present invention described above can be performed in combination. In addition, based on the display devices in each embodiment, a person ordinarily skilled in the art could add and remove appropriate structural components or make design changes, or add or omit processes or make condition changes and as long as the they do not deter from the premise of the present invention, these are included in the scope of the present invention.

In addition, other effects which are different to the effects provided by the forms of each embodiment described above are clear from the descriptions in the present specification and it should be interpreted that effects that could easily be predicted by a person ordinarily skilled in the art can be provided by the present invention.

What is claimed is:

1. A method of manufacturing a display device comprising steps of;
    forming a plurality of pixel circuits arranged on a substrate;
    forming a plurality of pixel electrodes, wherein each pixel electrode of the plurality of pixel electrodes corresponds to a pixel circuit of the plurality of pixel circuits;
    forming a bank between adjacent pixel electrodes of the plurality of pixel electrodes; exposing a part of the pixel electrodes;

forming an electroluminescent layer on the plurality of pixel electrodes;

forming a common electrode above the bank and the electroluminescent layer;

forming a plurality of insulators on exposed regions of the pixel electrodes; and forming an auxiliary wiring on the common electrode between adjacent insulators of the plurality of insulators, wherein a top surface of each of the plurality of insulators is farther from the substrate than a top surface of the common electrode, and the auxiliary wiring covers an edge part of each of the plurality of insulators and exposes a center part of the top surface of each of the plurality of insulators.

2. The method of manufacturing the display device according to claim 1, wherein each of the plurality of insulators is formed by an inkjet method.

3. The method of manufacturing the display device according to claim 1, wherein the auxiliary wiring is formed by an inkjet method.

4. The method of manufacturing the display device according to claim 1, further comprising a step of forming a sealing film to cover the common electrode and the auxiliary wiring after removing the insulator.

5. The method of manufacturing the display device according to claim 1, further comprising steps of:

providing an opposite substrate facing the plurality of pixels; and providing a filling material between the substrate and the opposite substrate, wherein the plurality of insulators and the filling material comprise a transparent resin.

6. The method of manufacturing the display device according to claim 1, further comprising a step of a plasma process performed using fluorine or a gas containing a fluorine compound on surfaces of the plurality of insulators.

7. A method of manufacturing a display device comprising steps of:

forming a plurality of pixel circuits arranged on a substrate;

forming a plurality of pixel electrodes, wherein each pixel electrode of the plurality of pixel electrodes corresponds to a pixel circuit of the plurality of pixel circuits;

forming a bank between adjacent pixel electrodes of the plurality of pixel electrodes;

exposing a part of the pixel electrodes;

forming an electroluminescent layer on the plurality of pixel electrodes;

forming a common electrode above the bank and the electroluminescent layer;

forming a plurality of insulators on exposed regions of the pixel electrodes;

forming an auxiliary wiring on the common electrode between adjacent insulators of the plurality of insulators;

providing an opposite substrate facing the plurality of pixels; and providing a filling material between the substrate and the opposite substrate, wherein the filling material comprises a same material as the plurality of insulators.

8. The method of manufacturing the display device according to claim 7, wherein each of the plurality of insulators is formed by an inkjet method.

9. The method of manufacturing the display device according to claim 7, wherein the auxiliary wiring is formed by an inkjet method.

10. The method of manufacturing the display device according to claim 7, further comprising a step of forming a sealing film to cover the common electrode and the auxiliary wiring after removing the insulator.

11. The method of manufacturing the display device according to claim 7, wherein the plurality of insulators and the filling material comprise a transparent resin.

12. The method of manufacturing the display device according to claim 7, wherein the auxiliary wiring covers an edge part of each of the plurality of insulators.

* * * * *